United States Patent
Debnath et al.

(10) Patent No.: US 8,258,818 B2
(45) Date of Patent: Sep. 4, 2012

(54) OPERATING A SWITCHED-CAPACITOR CIRCUIT WITH REDUCED NOISE

(75) Inventors: Chandrajit Debnath, Greater Noida (IN); Vigyan Jain, Rewari (IN); Adeel Ahmad, Lucknow (IN)

(73) Assignee: STMicroelectronics International N.V., Amsterdam (NL)

(*) Notice: Subject to any disclaimer, the term of this patent is extended or adjusted under 35 U.S.C. 154(b) by 32 days.

(21) Appl. No.: 12/650,041

(22) Filed: Dec. 30, 2009

(65) Prior Publication Data
US 2011/0001518 A1 Jan. 6, 2011

(30) Foreign Application Priority Data
Jul. 3, 2009 (IN) .......................... 1376/DEL/2009

(51) Int. Cl.
*G11C 27/02* (2006.01)
*H03K 5/00* (2006.01)
*H03K 17/00* (2006.01)

(52) U.S. Cl. ......................................... 327/94; 327/337

(58) Field of Classification Search .................. 327/91, 327/94–97, 337; 341/122–125
See application file for complete search history.

(56) References Cited

U.S. PATENT DOCUMENTS

| | | | |
|---|---|---|---|
| 5,959,565 A * | 9/1999 | Taniuchi et al. ............. | 341/172 |
| 6,515,612 B1 | 2/2003 | Abel | |
| 6,965,258 B2 * | 11/2005 | Bogner ............................ | 327/94 |
| 7,002,506 B1 * | 2/2006 | Tadeparthy et al. .......... | 341/161 |
| 7,088,147 B2 * | 8/2006 | Prasad et al. .................... | 327/91 |
| 7,157,956 B2 * | 1/2007 | Wei ................. | 327/337 |
| 7,307,572 B2 * | 12/2007 | Garrity et al. ................. | 341/172 |
| 7,595,666 B2 * | 9/2009 | Braswell et al. ................ | 327/96 |
| 7,671,776 B1 * | 3/2010 | Rangan et al. ................ | 341/150 |
| 2008/0284625 A1 * | 11/2008 | Joy et al. ....................... | 341/123 |

OTHER PUBLICATIONS

Norsworthy et al., "Delta-Sigma Data Converters, Theory, Design and Simulation," IEEE Press, 1997.

* cited by examiner

*Primary Examiner* — Quan Tra
(74) *Attorney, Agent, or Firm* — Wolf, Greenfield & Sacks, P.C.

(57) ABSTRACT

Techniques for operating a switched-capacitor circuit to reduce input and feedback dependence and/or reduce reference modulation. A switched-capacitor circuit can be operated in four phases. In a first phase at a start of a cycle, the capacitor is charged/discharged by a common mode signal to mask any residual charge stored in the capacitor from a previous cycle. In a second phase, the capacitor is charged with an input signal. During a third phase, the capacitor is charged with a wide-bandwidth auxiliary reference signal, and during a fourth phase the capacitor is charged with a reference signal. During the third and fourth phases, the capacitor may be coupled to an integrating circuit to integrate a difference between the input signal and the reference signal.

33 Claims, 11 Drawing Sheets

US 8,258,818 B2

OPERATING A SWITCHED-CAPACITOR CIRCUIT WITH REDUCED NOISE

RELATED APPLICATIONS

This application claims the priority benefit of Indian patent application number 1376/DEL/2009, filed on Jul. 3, 2009, entitled "A Method and System for Reducing Signal Dependent Charge Drawn from Reference Voltage Source," which is hereby incorporated by reference to the maximum extent allowable by law.

BACKGROUND

1. Field of Invention

Some embodiments of the present invention relate to techniques for operating a switched-capacitor circuit with reduced modulation of a reference signal. Some embodiments of the present invention relate to techniques for charging a capacitor of a switched-capacitor circuit in a manner that is input and feedback independent. More particularly, embodiments relate to methods and apparatuses for operating a switched-capacitor circuit in a manner that reduces or eliminates input signal dependence of a charge drawn from a reference voltage source.

2. Discussion of the Related Art

Analog and digital signal processing circuits may include switched-capacitor circuits to perform sampling or other operations on signals. For example, switched-apparatus circuits can be used in analog-to-digital converters and phase-locked loops (PLLs).

One type of switched-capacitor circuit includes a capacitor coupled to a ground and to an input by a switch, and to an output by another switch. When a first switch to the input is closed and a second switch to the output is open, during what is sometimes termed a "sampling phase," the capacitor is charged by an input signal applied to the input. When the states of the switches are reversed, such that the first switch to the input is open and a second switch to the output is closed, during what is sometimes termed a "transfer phase," the charge will flow out of the capacitor to the output.

Different switched-capacitor circuits may be implemented that include additional circuitry to perform operations on an input signal, or to receive other input signals. For example, switched-capacitor circuits may be implemented that apply a positive or negative gain to an input signal, integrate an input signal, find a difference between an input signal and a reference voltage, and integrate a difference between an input signal and a reference voltage, among other operations.

FIG. 1 shows one example of a switched-capacitor circuit that may be implemented to perform operations on an input signal. Specifically, the circuit 100 of FIG. 1 is arranged to perform an integration of a difference between an input signal $V_{in}$ and a reference voltage $V_{ref}$ supplied by a source 120. The circuit 100 includes a first capacitor 102 that is connected to the input $V_{in}$ and the reference voltage $V_{ref}$ via two pairs of switches S1, S4 and S2, S3. The circuit 100 also includes an integrator 110, which includes an operational amplifier (op-amp) 106 and a second capacitor 104.

Timing signals $\phi 1$ and $\phi 2$ are applied to the pairs of switches S1, S4 and S2, S3, as shown in FIG. 2. The signals are applied to control terminals of the switches such that the pairs of switches are switched open and closed in a non-overlapping manner; i.e., one pair is open when the other is closed.

The circuit 100 of FIG. 1 operates in the sampling phase while timing signal $\phi 1$ is high and the switches S1 and S4 are closed. During the sampling phase, capacitor 102 charges with the input signal $V_{in}$ to acquire a charge equal to $C_1 V_{in}$. At the end of the sampling phase, $\phi 1$ goes low and $\phi 2$ goes high, starting the integration phase. During the integration phase, an amount of charge $C_1(V_{ref}-V_{in})$ is added to (or discharged from) the capacitor, based on the relationship between $V_{ref}$ and $V_{in}$. Also during the integration phase, the capacitor 102 is connected to the integrator 110 to charge/discharge the capacitor 104.

Over a period of cycles (each cycle including a sampling phase and an integration phase), the capacitor 104 and op-amp 106 operate to provide a signal $V_{out}$ representing an integrated difference between $V_{in}$ and $V_{ref}$ over the period of cycles. At the end of cycle n, the charge on the capacitor 104 is:

$$C_2 V_{out}(n) = C_2 V_{out}(n-1) - C_1(V_{ref}-V_{in}) \qquad (1)$$

and, assuming that the op-amp 106 is ideal (infinite gain and infinite bandwidth) and the source 120 has zero output impedance, the output voltage $V_{out}(n)$ is:

$$V_{out}(n) = V_{out}(n-1) + (C_1/C_2)^*(V_{in}(n)-V_{ref}) \qquad (2)$$

It is not always possible to assume zero output impedance for the source 120 of the reference voltage $V_{ref}$. Additionally, at the start of the integration phase, the amount of charge added to or removed from the capacitor 102 is equal to $C_1(V_{ref}-V_{in})$, which is dependent on the input signal $V_{in}$ provided to the capacitor 102 during the sampling phase; specifically, the amount of charge is dependent on the amount of charge previously supplied from $V_{in}$ and its difference with $V_{ref}$. The amount of charge from $V_{in}$ stored by capacitor 102 also contributes to modulation of the reference voltage $V_{ref}$ when switch S2 connects $V_{ref}$ to capacitor 102.

If the source of reference voltage $V_{ref}$ has a settling time greater than the length of the switching signal $\phi 2$ (and greater than the integration phase), then the modulation affects the amount of charge added to (or discharged from) the capacitor 102, and an incorrect amount of charge will be added to (or discharged from) the capacitor 102. The error in the amount of charge transferred is dependent on the amount of charge stored in the capacitor 102 by the input signal $V_{in}$.

The error in the amount of charge transferred affects proper integration by the integrator 110 and could result in an integrator gain error. This integrator error could also affect the output of the circuit 100 over one or more cycles. For example, the error can cause an undesirable linearity error in an analog-to-digital converter. Some alternative circuits have been proposed to reduce the error.

FIG. 3 shows one circuit that has been proposed to alleviate signal-dependent charge errors in circuit 100 of FIG. 1. Circuit 300 of FIG. 3 uses a second capacitor 303 for the reference voltage $V_{ref}$, different from the capacitor 320 used for the input signal $V_{in}$. During the sampling phase $\phi 1$, the capacitor 303 is discharged to ground entirely (as shown by two switches coupled between the capacitor 303 and ground, operating based on signal $\phi 1$), transferring out all previous charge stored therein. During each integration phase $\phi 2$, a constant amount of charge is delivered to the capacitor 303. The constant amount of charge drawn from $V_{ref}$ is thus independent of signal $V_{in}$ as in circuit 100 of FIG. 1 (where the amount was dependent on $V_{in}$ and the difference). This constant amount could be correct in each cycle. The integrator, comprising operational amplifier 306 and capacitor 304, operates as described above with respect to the integrator 110 of FIG. 1.

Circuit 400 of FIG. 4 has also been proposed to address the problems with circuit 100 of FIG. 1. The circuit 400 of FIG.

4 includes a first capacitor 402, to which is applied an input signal $V_{in}$, and a second capacitor 403, to which is applied an inverted form of input signal $V_{in}$ provided by the inverter 415. During a sampling phase φ1, $V_{in}$ and $-V_{in}$ are respectively applied to capacitor 402 and capacitor 403. During phase φ2, the reference voltage $V_{ref}$ is applied to both capacitors 402, 403 and supplies a charge to (or removes a charge from) both.

Each capacitor 402, 403 may draw a signal-dependent charge from the reference voltage $V_{ref}$, though because of the inverter 415 the capacitors 402, 403 are oppositely charged. The signal-dependent charges drawn from the reference voltage $V_{ref}$ are thus oppositely signed and would cancel one another. The source 420 of reference voltage $V_{ref}$ would thus see no impedance and would not be modulated, helping ensure that a correct amount of charge from $V_{ref}$ is added to the capacitor 402 during the phase φ2. The integrator 410 operates as described above with respect to the integrator 110 of FIG. 1.

SUMMARY

In one embodiment, there is provided a method of operating a switched-capacitor circuit. The method comprises applying a first signal to a capacitor such that the capacitor has a first amount of charge, applying an input signal to the capacitor having the first amount of charge, such that the first amount of charge is changed by the input signal, and applying a reference signal to the capacitor following application of the input signal. In the method, the first signal is a signal held at a constant voltage value during the applying of the first signal.

In another embodiment, there is provided a circuit comprising a capacitor, a first node adapted to receive an input signal and coupled via a first switch to a terminal of the capacitor and a second node adapted to receive a reference signal and coupled via a second switch to the terminal of the capacitor. The circuit further comprises a third node adapted to receive a first signal, the first signal being a constant voltage signal, and coupled via a third switch to the terminal of the capacitor.

In a further embodiment, there is provided a method of operating a switched-capacitor circuit. The method comprises applying an input signal to a capacitor such that an amount of charge stored by the capacitor is changed by the input signal, applying a first reference signal to the capacitor such that the amount of charge is changed by the first reference signal, and applying a second reference signal to the capacitor such that the amount of charge is changed by the second reference signal.

In another embodiment, there is provided a circuit comprising a capacitor, a first node adapted to receive an input signal and coupled via a first switch to a terminal of the capacitor, a second node adapted to receive a first reference signal and coupled via a second switch to the terminal of the capacitor, and a third node adapted to receive a second reference signal and coupled via a third switch to the terminal of the capacitor.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 2:
FIG. 2 is a timing diagram showing signals used to operate switches included in the first switched-capacitor circuit of FIG. 1.
Figure 2:
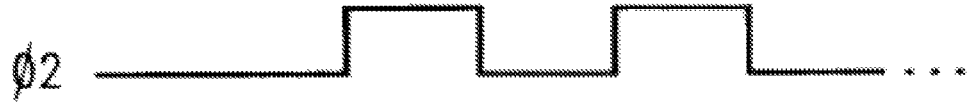
Figure 3:
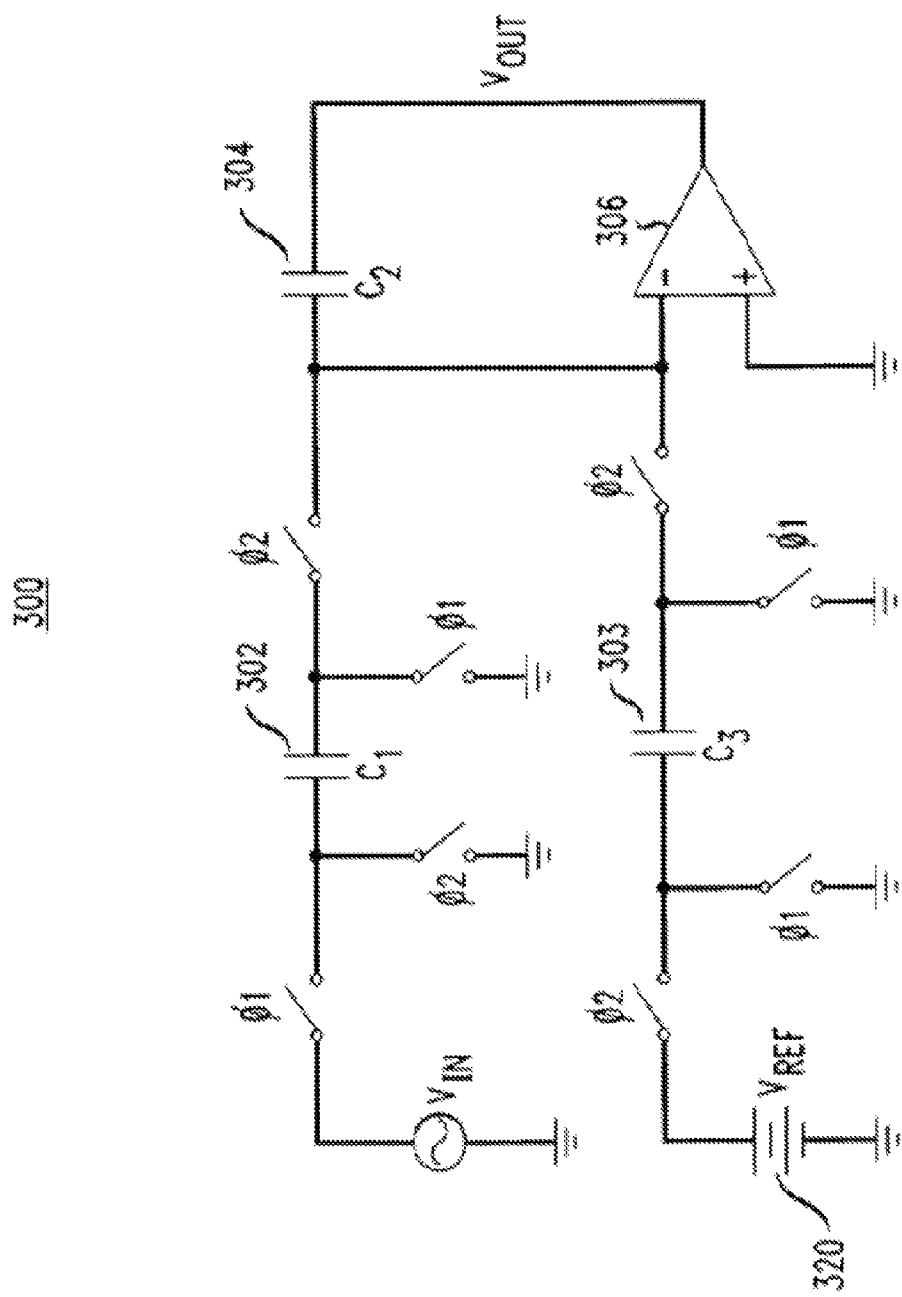
FIG. 3 is a diagram of a second switched-capacitor circuit implemented using conventional techniques.

Various circuits have been proposed for reducing or eliminating modulation of a reference voltage in a switched-capacitor circuit that includes a reference voltage, including the circuits 200 and 300 of FIGS. 2 and 3. Though, each of these circuits suffers from various disadvantages that may reduce their desirability, or make them unsuitable, for some environments and/or applications.

In the circuit 300 of FIG. 3, the additional capacitor 303 added to the circuit (with respect to the circuit 100 of FIG. 1) adds to the load seen by the operational amplifier 306. The extra load created by the additional capacitor 303 reduces the feedback factor for the op-amp 306, which reduces the closed loop bandwidth of the circuit 300 and degrades its settling performance as well as reduces the gain of the op-amp 306. These feedback properties may be undesirable in some environments/applications. Additionally, doubling the number of input paths—having two paths for the input signal $V_{in}$ and for the reference voltage $V_{ref}$—doubles the thermal noise (kT/C) of the circuit, such that the thermal noise is 3 dB higher than the circuit 100 of FIG. 1. This amount of noise may be undesirable in some environments/applications. Also, the circuit 300 occupies an amount of space greater than that of circuit 100 of FIG. 1 because of the additional path and additional capacitor, that may be larger than desired for some environments/applications.

Figure 4:
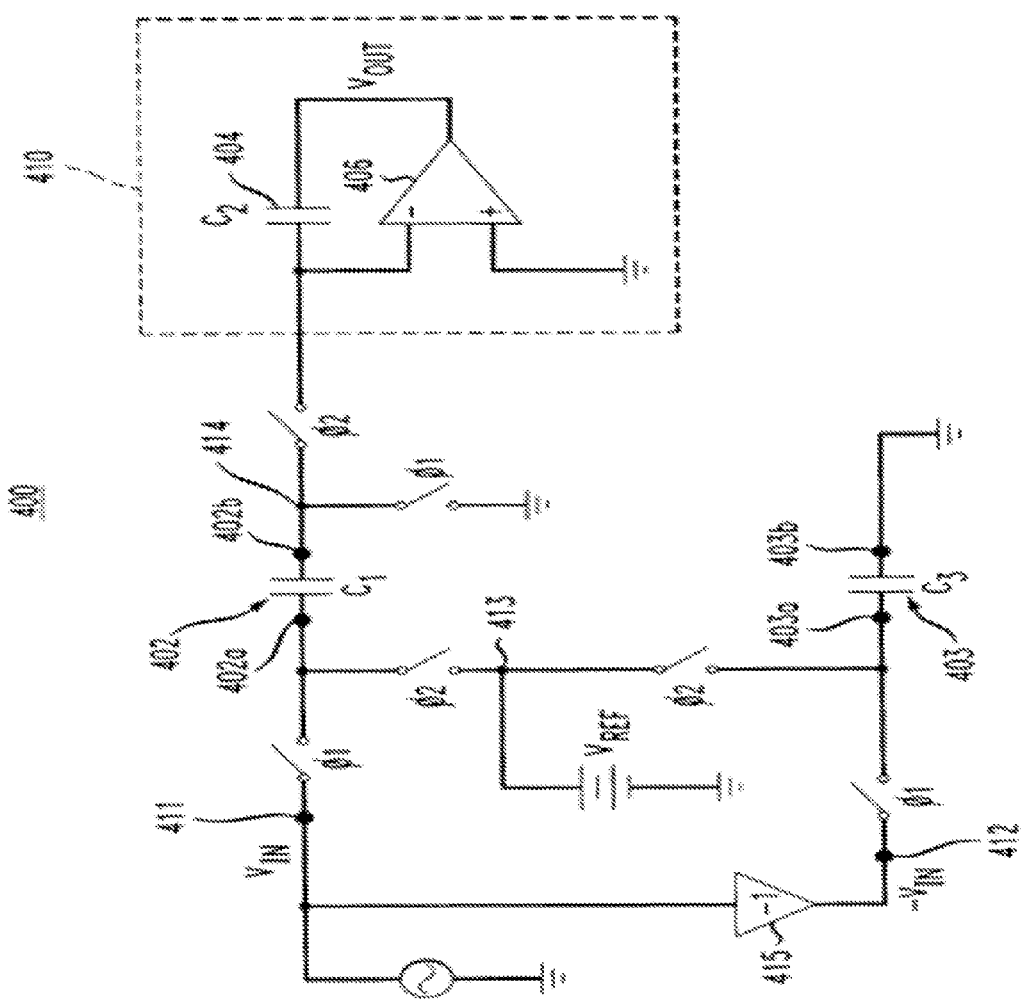
FIG. 4 is a diagram of a third switched-capacitor circuit implemented using conventional techniques.

Circuit 400 of FIG. 4 attempts to the solve the problem of added load for the op-amp 406 by removing the additional capacitor from the signal path to the op-amp 406. Specifically, the capacitor 403 is on a different signal path than the capacitor 402 and does not substantially affect the op-amp 406 or increase the load on the op-amp 406. The effective load at the signal source (the source of doubles because of the two signals paths from $V_{in}$ to capacitors 402, 403. This affects the settling performance of $V_{in}$ and affects the rest of the circuit and the charge applied to the capacitors 402, 403, which may be undesirable in some environments/applications. The circuit 400 also occupies an amount of space greater than that of circuit 100 of FIG. 1, because of the additional path and the additional capacitor, that may be larger than desired for some environments/applications.

Figure 1:
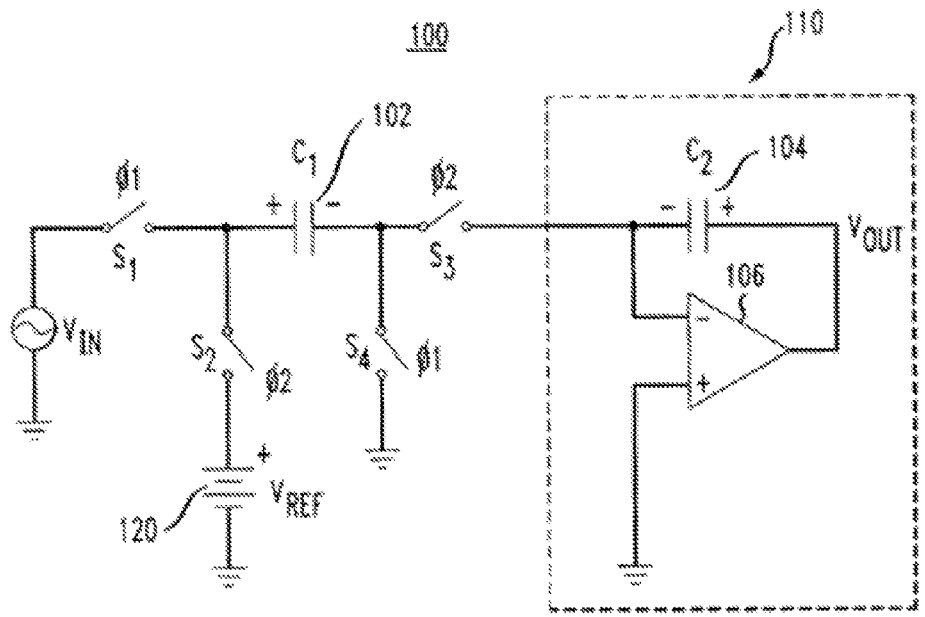
FIG. 1 is a diagram of a first switched-capacitor circuit implemented using conventional techniques.

Additionally, in some cases the circuits 100, 200, 300 of FIGS. 1-3 may exacerbate problems generated by circuits or systems outside of the circuits 100, 200, 300. Some switched-capacitor circuits may accept an input signal $V_{in}$ from one or more signal conditioning circuits. For example, an anti-aliasing filter (AAF) may be implemented in a system to condition the input signal $V_{in}$ before it is input to the switched-capacitor circuits. The switched-capacitor may cause a non-zero output impedance that may introduce disturbances and noise into the input signal $V_{in}$ that would then be input to the switched-capacitor circuit. This disturbance may be called "kickback noise."

This noise may be exacerbated when a switched-capacitor circuit—such as circuits 100, 300—uses one path for both phases φ1 and φ2. When implemented in this way, the capacitor may be discharged by (or possibly to) reference voltage $V_{ref}$ during φ2 and must be charged again by $V_{in}$ during φ1. Thus, the signal-conditioning circuit must apply the noisy signal $V_{in}$ to the capacitor during φ1. As the signal is applied, the noise inserted by the signal-conditioning circuit is also applied and charges the capacitor. This affects the signal-to-noise ratio (SNR) of the input signal $V_{in}$ and is typically not recoverable by conventional noise-shaping techniques.

In the worst case, a reference voltage $V_{ref}$ is at ground and the capacitor has been fully discharged to ground during φ2, and an input signal $V_{in}$ is at its maximum amplitude. In this case, the capacitor needs to be charged or discharged the greater amount and a large amount of noise will be applied to the capacitor, thereby degrading SNR.

Further, in each of the proposed circuits 100, 200, and 300, if a source of the input signal $V_{in}$ does not have sufficient bandwidth to charge the capacitor 102 to the full amount during phase φ1 of one cycle, one or more subsequent cycles may be affected. This is because the amount of charge that may be added to (or discharged from) a capacitor of the switched-capacitor circuit is dependent on charge that exists on the capacitor at the start of a cycle (i.e., at the end of the previous cycle). Thus, improper or inadequate charging of the capacitor in one stage may impact the subsequent stage(s) and may impact the signal-to-noise ratio of the output signal of the switched-capacitor circuit by inserting harmonic distortion into the signal.

Some of the principles described herein relate to techniques for reducing or eliminating a signal-dependent charge added to or drawn from a capacitor of the switched-capacitor circuit by a reference signal. Other principles described herein relate to techniques for reducing or eliminating a modulation of a reference signal applied to a capacitor in a switched-capacitor circuit. Still other principles described herein relate to techniques for reducing a dependence of subsequent stages on a charge applied to (e.g., added to or discharged from) a capacitor by an input signal in one stage.

In some embodiments of techniques described herein, a capacitor of a switched-capacitor circuit is operated in four phases. The capacitor is adapted to be charged and/or discharged at least by an input signal and by a reference signal. In one particular implementation, the capacitor is adapted to be charged by the input signal and discharged by the reference signal, though other implementations are possible. In a first phase at a start of a cycle, the capacitor is charged/discharged to a common mode signal to reduce, eliminate, or mask any residual charge stored in the capacitor from a previous cycle. In a second phase, the capacitor is charged with an input signal to hold an amount of charge corresponding to a value of the input signal. During a third phase, the capacitor is charged with a wide-bandwidth auxiliary reference signal having a short settling time (preferably within the time span of the third phase) and during a fourth phase the capacitor is charged with a reference signal. During the third and fourth phases, the capacitor may be coupled to an integrating circuit to integrate over time and output a difference between the input signal and the reference signal.

These techniques can reduce or eliminate dependence of a cycle (a cycle comprising the four phases) on preceding cycles by reducing, eliminating, or masking previously-stored charge in a capacitor during the first phase. Another advantage is that these techniques can reduce or eliminate modulation of the reference signal by applying a high-bandwidth auxiliary reference signal to the capacitor that settles before the reference signal is applied. Signal-dependent may be drawn from the auxiliary reference signal and not from the reference signal, reducing or eliminating reference modulation and reducing or eliminating the signal-dependent charge drawn from the reference signal.

Figure 5:
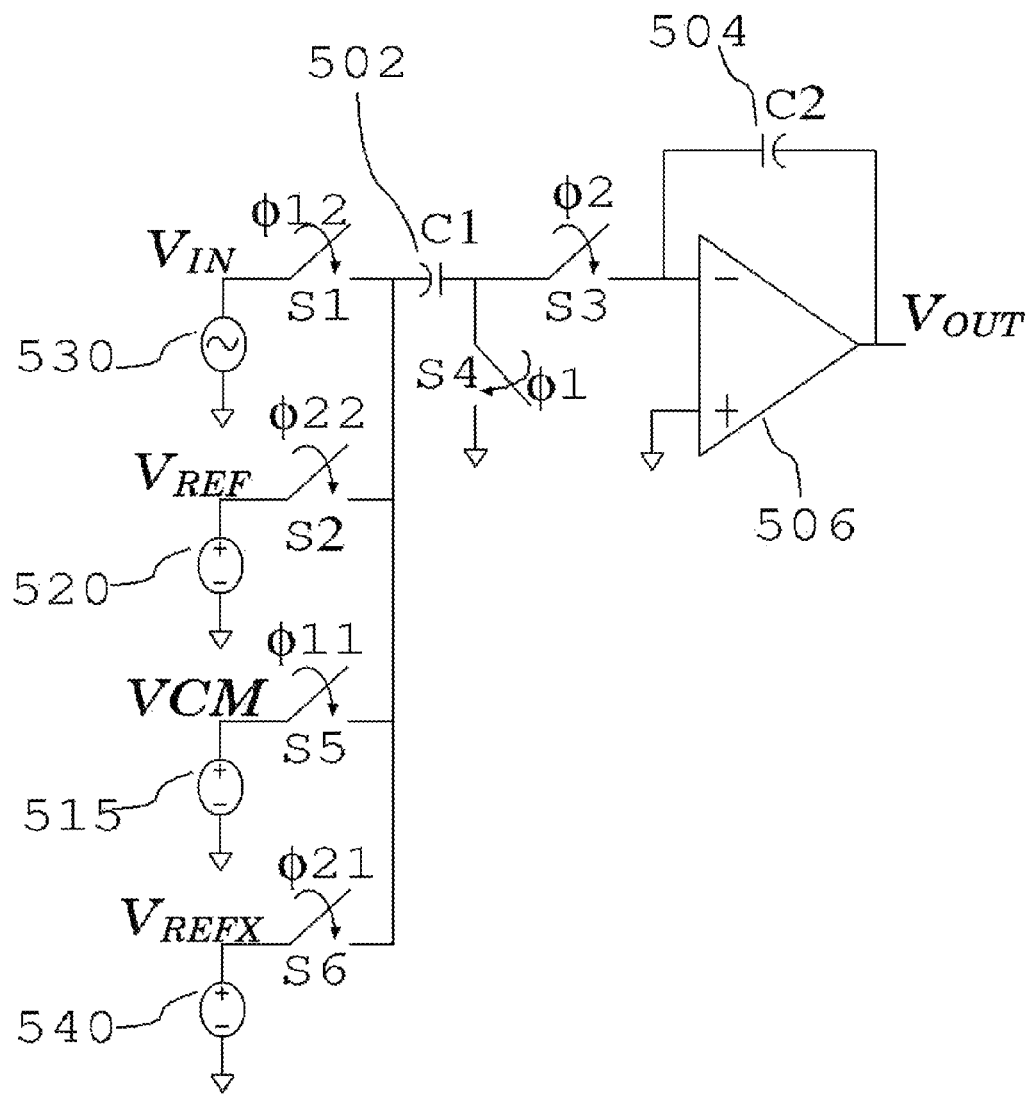
FIG. 5 is a diagram of a first embodiment of a switched-capacitor circuit operating according to techniques described herein.
Figure 6:
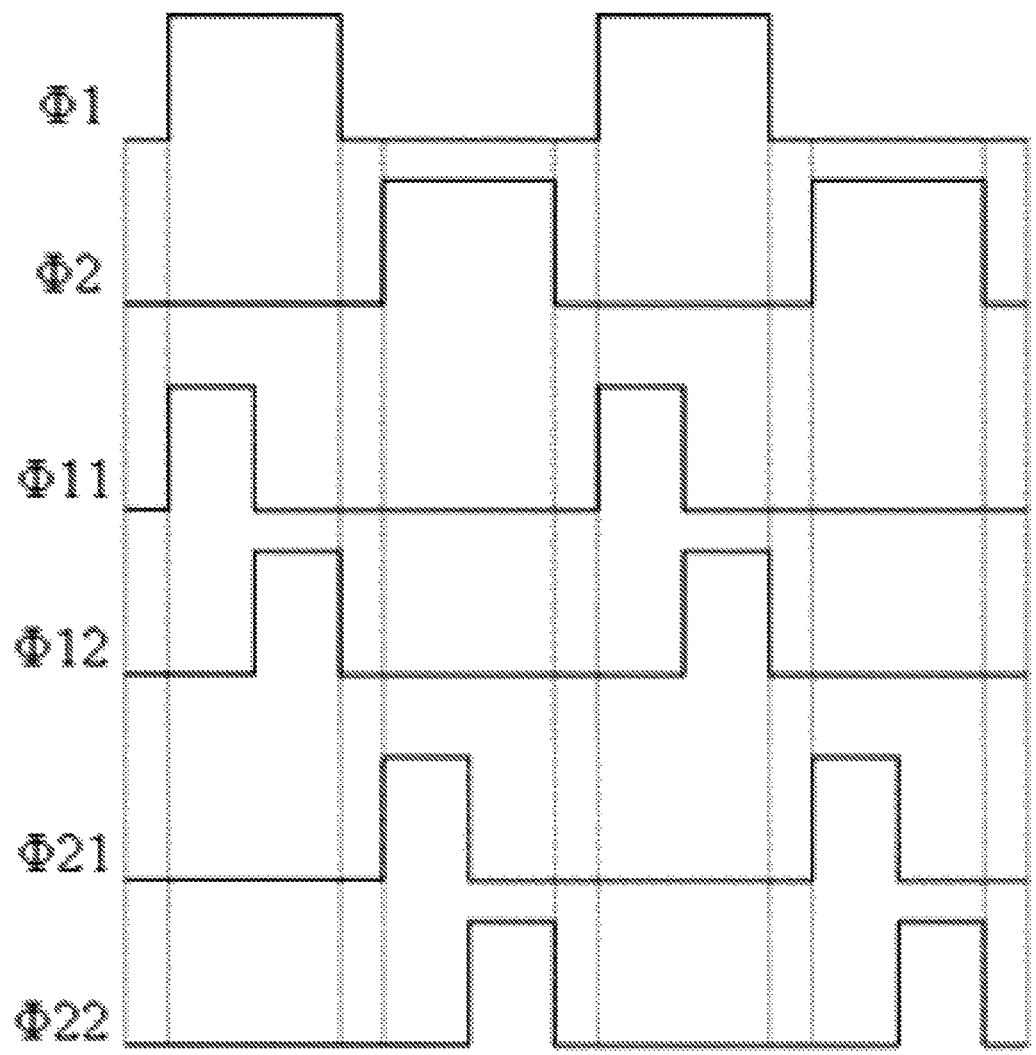
FIG. 6 is a timing diagram showing signals used to operate switches included in the switched-capacitor circuit of FIG. 5.

FIG. 5 shows a switched capacitor according to the same embodiments having switches operating according to timing signals shown in FIG. 6.

FIG. 5 shows a switched-capacitor circuit 500 including capacitor 502, having a capacitance $C_1$, that is connected to an integrating circuit having an op-amp 506 and a second capacitor 504 having a capacitance $C_2$. The capacitor 502 is connected to a ground by a switch S4, operating according to a timing signal φ1, and is connected to the integrating circuit by a switch S3, operating according to a timing signal φ2. As shown in FIG. 6, timing signals φ1 and φ2 are oppositely timed, having only a short time span between them, and non-overlapping. Though, in other embodiments the signals may be timed in any other manner, such as by overlapping or by having a greater time between switching.

The switched-capacitor circuit 500 is also connected via switches to several inputs. In the example of FIG. 5, the circuit has four inputs connected to the capacitor via four switches, though other embodiments may have more or fewer inputs than circuit 500. The four switches S1, S2, S5, S6 may operate according to respective timing signals φ12, φ22, φ11, and φ21, illustrated in FIG. 6. Timing signals φ11 and φ12 for switches S5 and S1 switch during the "high" or "on" period of timing signal φ1 for switch S4, as also shown in FIG. 6, and timing signals φ21 and φ22 switch during the "high" or "on" period of timing signal φ2 for switch S3.

Circuit 500 of FIG. 5 operates over a series of cycles, each cycle having four phases corresponding to the four timing signals φ12, φ22, φ11, and φ21. These four phases may also be considered to be "subphases" of two main phases corresponding to the timing signals φ1 and φ2. For illustration, FIG. 6 shows two cycles of operation of the circuit 500, with each phase occurring twice. During the first cycle, signals φ11, φ12, φ21, and φ22 switch on in succession, then the second cycle begins and signals φ11, φ12, φ21, and φ22 switch on in succession again. The time between the phases/subphases may be any suitable length of time, including a time related to the length of the phases/subphases. For example, the time between phases/subphases may be one percent of the time length of a phase/subphase.

In one cycle, the switch S4 first closes to connect the capacitor 502 to ground in response to timing signal φ1 going high. At a similar time to the signal φ1 going high (e.g., a short time before, at the same time, or at a short time after), the first subphase begins and the switch S5, in response to timing signal φ11 going high, closes to connect the capacitor 502 the source 515 of the common mode signal $V_{CM}$. Common mode signal $V_{CM}$ may be, for example, a direct current (DC) voltage signal. As discussed in greater detail below, the signal $V_{CM}$ may be any suitable signal, including a constant signal held at any suitable constant voltage (e.g., a signal at an average voltage of the input signal $V_{in}$, a ground signal, a voltage-divided form of $V_{ref}$, etc.).

As shown in FIG. 6, after a period of time the timing signal φ11 goes low, disconnecting the capacitor 502 from the common mode signal $V_{CM}$ and ending the first subphase. This period of time of the first subphase is preferably long enough to charge the capacitor based on common mode signal $V_{CM}$, though the period of time may be of any suitable length. The second subphase then begins when timing signal φ12 goes high. In response, switch S1 closes and connects source 530 of input signal $V_{in}$ to capacitor 502 and input signal $V_{in}$ begins charging capacitor 502.

After a period of time, preferably long enough for signal $V_{in}$ to charge the capacitor 502 to a desired level, timing signal φ12 goes low and the second subphase ends. Then the signal φ1 also goes low and switch S4 opens to disconnect capacitor 502 from ground. After a short time, the signal φ2 goes high and switch S3 closes to connect capacitor 502 to the integrating circuit, including the op-amp 506 and the capacitor 504.

As discussed below, while capacitor 502 is connected to the integrating circuit, timing signals φ21 and φ22 also go high and low to operate switches S2 and S6 in the third and fourth subphases. While the capacitor 502 is coupled both to the integrating circuit and one of the voltage sources 520, 540, the capacitor 504 begins to charge with the signal output from the capacitor 502 and amplified by the op-amp 506. The integrating circuit may operate in any suitable manner, including according to techniques known in the art such as the manner shown above in connection with circuit 100 of FIG. 1.

In a third subphase of the cycle, signal φ21 goes high and switch S6 closes to connect source 540 of the auxiliary reference signal $V_{refx}$ to the capacitor 502. $V_{refx}$ may be a high-bandwidth signal that has a fast settling time and has a relatively low signal-to-noise ratio, though has a same voltage as signal $V_{ref}$.

At the end of the third subphase, the capacitor 502 is fully charged with charge from both the input signal $V_{in}$ and the reference voltage of $V_{refx}$ (and $V_{ref}$). Though, the charge on the capacitor 502 and output by the capacitor 502 and received by the integrating circuit may have a low signal-to-noise ratio, as the reference voltage was applied by the noisy signal $V_{refx}$.

At the end of the third subphase, the timing signal φ21 goes low and switch S5 opens to disconnect the capacitor 502 from the source 540 of auxiliary reference signal $V_{refx}$. At a similar time (e.g., a short time before, at the same time, or at a short time after) timing signal φ22 goes high and switch S2 closes to connect the capacitor 502 to source 520 of the reference signal $V_{ref}$. The substantially noiseless signal $V_{ref}$ can reduce noise being output from the capacitor 502 into the integrating circuit.

As shown in FIG. 6, after a period of time, the signal φ22 goes low, the switch S2 opens, and the fourth subphase ends. The signal φ2 may also go low, such that the switch S3 opens and the cycle ends. The charge on the capacitor 504 may now reflect a relationship between the input signal $V_{in}$ and the reference signal $V_{ref}$, such as a difference between the signals. As above in circuit 100 of FIG. 1, the output voltage $V_{out}$ and the charge on the capacitor 504 may be dependent on the difference between $V_{in}$ and $V_{ref}$ in this cycle and in previous cycles, operating as an integrator of the difference over time.

Once the cycle ends, a new cycle may begin with signal φ1 going high to connect capacitor 502 to ground and signal φ11 going high to connect capacitor 502 to source 515 of the common mode signal $V_{CM}$. The cycles and subphases may repeat until the timing signals stop, which may be following any suitable number of cycles.

In the example of FIG. 5, $V_{CM}$ is a constant reference voltage set at any suitable level. Examples given above include an average voltage value of varying input signal $V_{in}$ and a voltage-divided form of $V_{ref}$. When switch S5 closes and connects $V_{CM}$ to capacitor 502, capacitor 502 is charged by the current flowing through source 515 to a charge dependent on the voltage value of $V_{CM}$ at that time. During the first subphase of the cycle, then, signal $V_{CM}$ masks the charge that may be stored on the capacitor 502 from a previous cycle. $V_{CM}$ does this by ensuring that at the start of each cycle, following the first subphase, the capacitor 502 is always charged to a same reference value and starts from a known state, rather than from some unknown and varying state dependent on the charge stored from a previous cycle. In this way, subsequent subphases of this cycle are not influenced by the charge stored on capacitor 502 from previous cycles.

Applying signal $V_{CM}$ in this way reduces or eliminates the previous-cycle-dependent charge that will later be drawn from the input signal $V_{in}$ and reduces the input and feedback dependence of a cycle of the circuit 500.

Further, in some implementations of the example of FIG. 5, signal $V_{CM}$ is proportional to a voltage level of the input signal $V_{in}$. For example, $V_{CM}$ may be set as an average voltage value of input $V_{in}$. The average voltage value may be set in advance based on known characteristics of the input signal $V_{in}$, or can be output from a circuit tracking a value of $V_{in}$ and producing an output that is the average of $V_{in}$. Such tracking circuits are known in the art. Though, any value that is proportional to $V_{in}$ may be used. In this way, before input signal $V_{in}$ is applied the capacitor 502 may be charged to a value that is a fraction (e.g., half, one-third, two-thirds, etc.) of the value of input signal $V_{in}$. Similarly, if $V_{CM}$ is proportional to the reference signal $V_{ref}$, such as a voltage-divided form of $V_{ref}$, then the signal $V_{CM}$ may charge the capacitor 502 to a value that is a fraction of the value of input signal $V_{in}$. $V_{CM}$ having a value that is a fraction of $V_{in}$ has benefits during the second subphase of the cycle, when the capacitor 502 is connected to the input signal $V_{in}$, which are discussed further below.

While $V_{CM}$ is described as masking the charge previously stored on the capacitor 502 by charging to a known or fixed value dependent on $V_{CM}$, in other cases signal $V_{CM}$ may discharge the capacitor 502 partly or entirely to reduce or eliminate the dependence of the charge drawn from input signal $V_{in}$ on the charge previously stored on the capacitor 502. In various embodiments of the invention that include a common mode signal $V_{CM}$, the signal $V_{CM}$ may be applied in any suitable manner to reduce, eliminate, or mask charged previously stored on the capacitor 502.

Because signal $V_{CM}$ has previously charged the capacitor 502 to some value, the input signal $V_{in}$ in subphase two (corresponding to timing signal φ12 going high) needs to only charge the capacitor to a value depending on a difference between $V_{CM}$ and $V_{in}$. Where $V_{CM}$ is an average form of $V_{in}$ or proportional to $V_{ref}$ as in some embodiments of FIG. 5, then this value is a fraction of $V_{in}$ (e.g., half of the maximum value of $V_{in}$ or half of $V_{ref}$). This may have two benefits. First, the charge stored on the capacitor 502 may impact the modulation of input signal $V_{in}$. For example, pre-charging with a common mode signal may lower the modulation of the input signal $V_{in}$ as compared to other switched-capacitor circuits, such as circuits where the capacitor has no stored charge when $V_{in}$ is applied. Thus, $V_{in}$ may settle more quickly when applied, reducing the noise applied to the capacitor 502 and improving the signal-to-noise ratio of the circuit 500. Further, because capacitor 502 has been charged to some value by the signal $V_{CM}$, signal $V_{in}$ needs to charge the capacitor 502 less than in other switched-capacitor circuits. For example, where $V_{CM}$ is at a value corresponding to half of $V_{in}$, $V_{in}$ needs to charge the capacitor 502 half the amount that it would in an alternative circuit where capacitor 502 has no stored charge when $V_{in}$ is applied. Reducing the amount of charge that signal $V_{in}$ drives to the capacitor 502 also reduces the amount of kickback noise driven to the capacitor 502 and improves to the signal-to-noise ratio of the circuit 500.

In the example of FIG. 5, $V_{refx}$ is a high-bandwidth signal that has a fast settling time and has a relatively low signal-to-noise ratio, though has a same voltage as signal $V_{ref}$. The characteristics of $V_{ref}$ and $V_{refx}$ (e.g., bandwidth, noise levels, settling time, etc.) can be selected based on desired properties of the switched-capacitor circuit, including desired charge/voltage accuracies and desired signal-to-noise ratios, that may change between applications and environments. Signal $V_{refx}$ quickly charges capacitor 502 with the reference voltage of signals $V_{ref}$ and $V_{refx}$. Because $V_{refx}$ is a high-bandwidth signal with a fast settling time, signal $V_{refx}$ ideally fully settles within the third subphase and during the high/on period of timing signal φ21. As discussed above in connection with circuit 100 of FIG. 1, when the auxiliary signal $V_{refx}$ is applied to the capacitor 502 charged with the signal $V_{in}$, the amount of charge drawn from $V_{refx}$ is substantially dependent on the amount of charge stored in the capacitor 502 from signal $V_{in}$. In other words, this charge is input-signal dependent.

When reference signal $V_{ref}$ is applied to the capacitor 502 during the fourth subphase, because the auxiliary signal $V_{refx}$ has charged the capacitor 502 to a level based on the voltage of the signals $V_{refx}$ and $V_{ref}$, substantially no input-signal dependent charge is drawn from source 520 of signal $V_{ref}$. Rather, a constant amount of charge may be drawn from source 520. The source 520 of signal $V_{ref}$ thus has substantially reduced modulation. Because there is substantially no modulation, the signal $V_{ref}$ will settle substantially faster than with more modulation, and will preferably settle within the time span of the fourth subphase.

Thus, a signal-dependent charge drawn from the reference signal $V_{ref}$ is reduced or eliminated and the modulation of the reference signal $V_{ref}$ is reduced or eliminated by applying the auxiliary reference signal $V_{refx}$ to the capacitor first.

Figure 7:
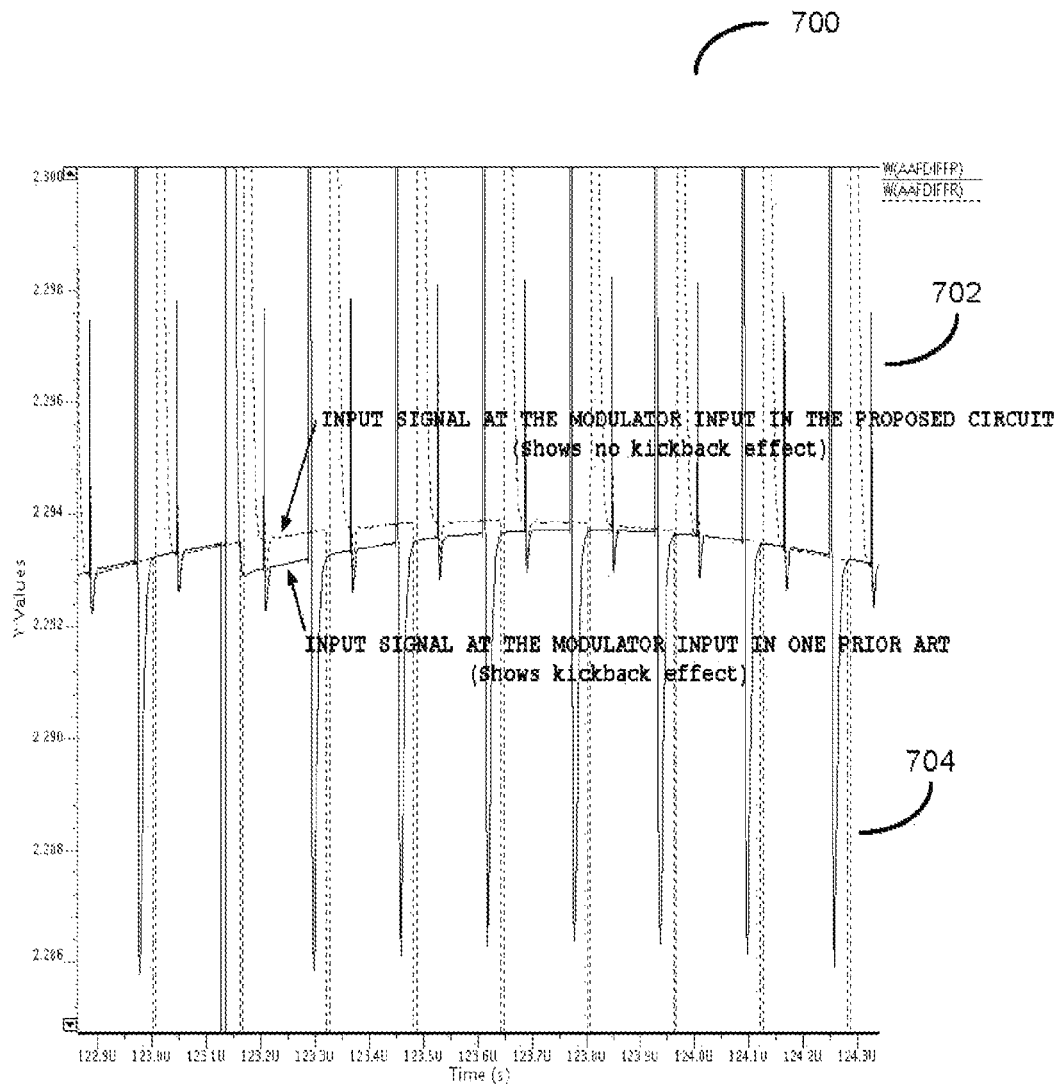
FIG. 7 is a graph showing a difference in kickback effect experienced by sources of input signals of the circuit of FIG. 1 and the circuit of FIG. 5.
Figure 8:
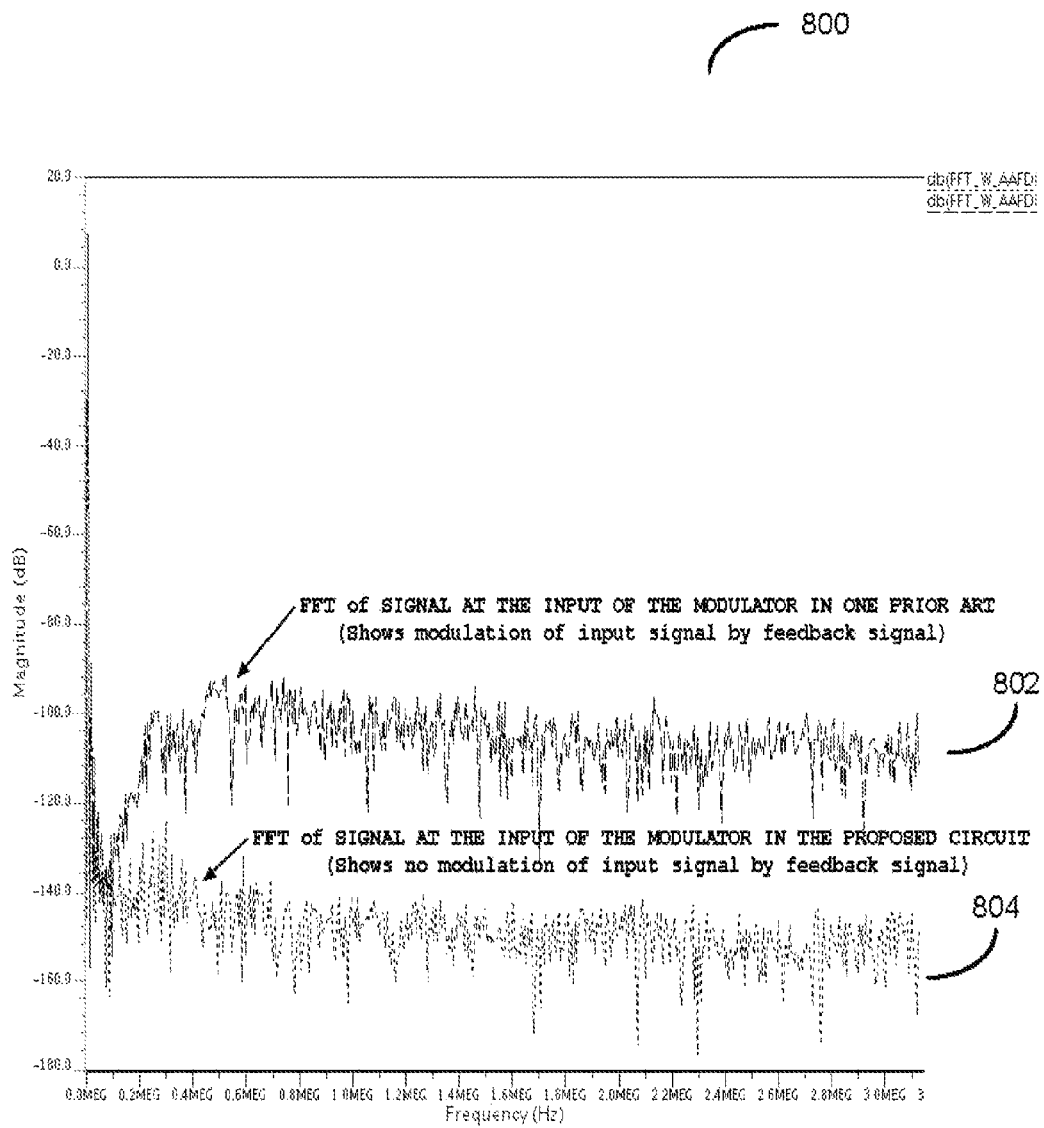
FIG. 8 is a graph showing a difference in modulation of an input signal of the circuit of FIG. 1 and the circuit of FIG. 5.
Figure 9:
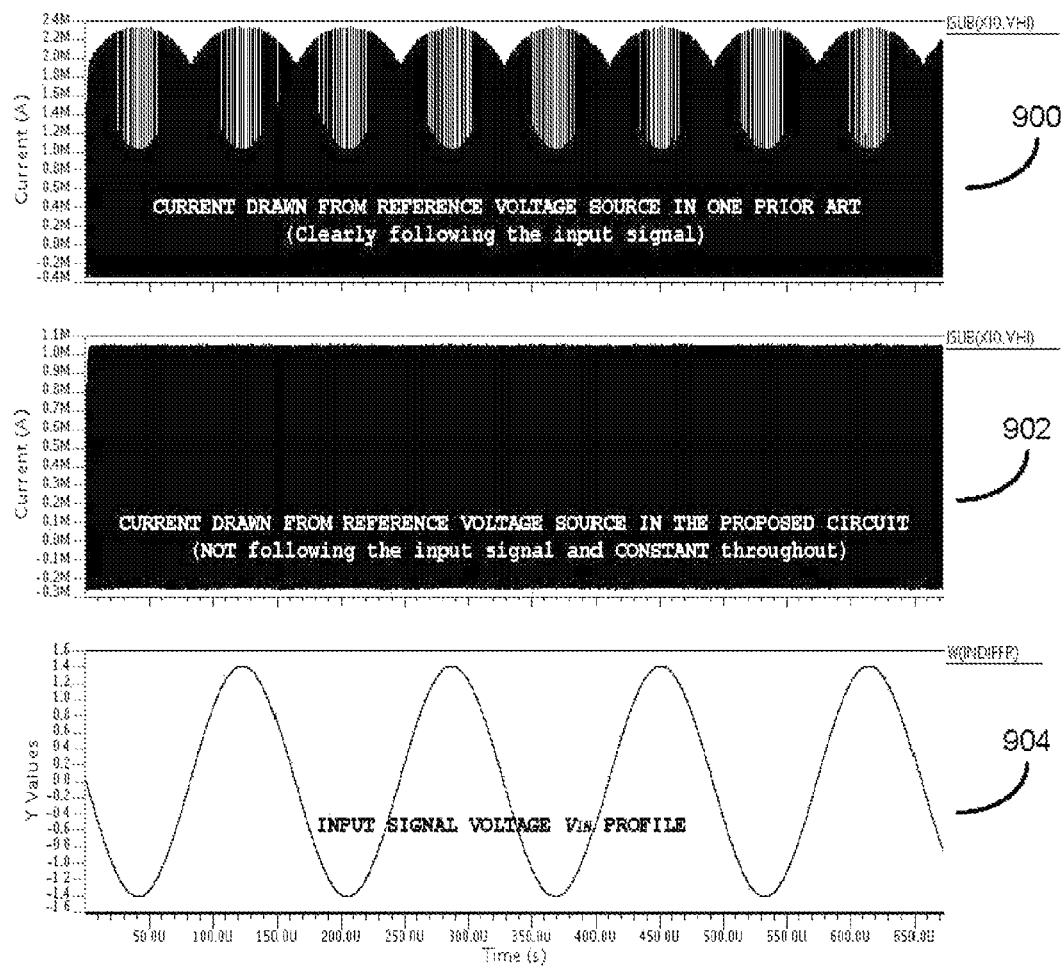
FIG. 9 shows three graphs showing a modulation of a reference signal of the circuit of FIG. 1 and the circuit of FIG. 5 for a given input signal.

These and other advantages of the implementation shown in FIG. 5 over prior art circuits are illustrated in graphs of FIGS. 7-9.

The graph 700 of FIG. 7 shows this reduction of kickback and kickback noise. The solid line 702 of the graph 700 shows the kickback effect experienced by the input signal of circuit 100 of FIG. 1. As the graph shows, at time 123.2 U, when the sinusoidal input signal is connected to the capacitor, the signal drops in value slightly from the original and does not return to the normal value sinusoidal value until time 124.0 U. This drop in value causes the errors and noise that affect the output signal and the circuit of FIG. 1 and make that circuit undesirable. As shown by the dotted line 704 of the graph 700, though, the input signal of exemplary circuit 500 of FIG. 5 does not have a substantial kickback effort and substantially maintains the smooth sinusoidal curve. This illustrates that the circuit of FIG. 5 does not have substantial kickback effect and does not cause errors and noise that substantially affect the output signal and circuit of FIG. 5.

The graph 800 of FIG. 8 also illustrates the benefits of the exemplary circuit 500 of FIG. 5 over the circuit 100 of FIG. 1.

Graph 800 shows a fast Fourier transform (FFT) of the input signals of circuits 100 and 500, showing the magnitude of frequencies included in the input signals. As shown in the graph 800, the input signal of circuit 500 experiences substantially less modulation (i.e., no modulation) as compared to the input signal of circuit 100. This is shown by the drop in the noise floor. The average noise magnitude in the conventional circuit, as shown by the signal 802, is approximately −100 dB, while the average noise magnitude in a circuit operating as illustrated in FIG. 5, as shown by the signal 804, has an average noise magnitude of approximately −140 dB.

FIG. 9 shows three graphs illustrating the difference in modulation of the reference signal between the circuit 100 of FIG. 1 and the exemplary circuit 500 of FIG. 5. For a given input signal, shown in graph 904, graphs of two reference signals are shown. Each of the reference signals is a fixed voltage signal, and a constant current should be drawn from each of the reference signals to properly charge the capacitor. Graph 900, however, shows a noisy oscilloscope trace of the current drawn from the reference signal that is applied to circuit 100 of FIG. 1. Graph 900 shows a clear modulation of the current drawn, such that the current is dependent on the input signal and takes on a roughly sinusoidal shape that mimics the input signal shown in graph 904. The modulation of the current drawn by the reference signal by the input signal means that the fixed signal is not consistently applied to the circuit 100 in each second, causing errors and noise in the signal output by the circuit 100, such as linearity errors in analog-to-digital converters that incorporate the switched-capacitor circuit.

Graph 902 shows a noisy oscilloscope trace of the current drawn from reference signal as applied in the exemplary circuit 500 of FIG. 5. The graph 902 shows a substantially flat and unvarying current level and illustrates that the circuit 500 does not substantially modulate the reference signal applied to the circuit 500. At all times, a substantially constant (current spikes being about the same magnitude at all times) amount of current is drawn by the circuit. This reduces or eliminates errors and noise caused by reference modulation in conventional circuits. Further, even if an error or amount of noise is present in the signal, because a substantially constant current is drawn at all times, that error/noise will affect the circuit equally at all times, and thus the error/noise will not cause sampling errors or other errors in the switched-capacitor circuit.

The illustrative embodiment of a switched-capacitor circuit shown in FIG. 5 operates in four subphases per cycle to produce a signal indicative of an integrated difference between an input signal $V_{in}$ and a reference signal $V_{ref}$. As discussed above, operating the circuit in a first subphase to charge the capacitor with a common mode signal $V_{CM}$ and in a third subphase to charge the capacitor with an auxiliary reference signal $V_{refx}$ has various benefits for the circuit. Though, it should be appreciated that not all embodiments are limited to implementing the four subphases, and not all embodiments are limited to operating in the first and third subphases. Rather, some embodiments may operate in less than all four subphases or may operate in a different four subphases. For example, in some embodiments of the invention three subphases may be implemented per cycle: charging with a common mode signal, charging with the input signal, and charging with a reference signal. In other embodiments, another three subphases may be implemented: charging with the input signal, charging with an auxiliary reference signal, and charging with a reference signal. Embodiments of the invention may operate a switched-capacitor circuit in any suitable manner.

In embodiments that apply a common mode signal, like the embodiment of FIG. 5, common mode signal $V_{CM}$ may be any suitable fixed or varying voltage or signal that could be applied to the capacitor 502. Such signals include a ground voltage for the circuit 502, a power supply voltage for the circuit 502, an intermediate voltage between the ground voltage and the power supply voltage, a signal related to the input signal $V_{in}$ and/or reference signal $V_{ref}$, or any other signal. If the common mode signal $V_{CM}$ is a signal related to the input signal $V_{in}$ and/or $V_{ref}$, it may in some cases be an average form of the input signal $V_{in}$, a voltage-divided form of $V_{ref}$, a signal having a value halfway between $V_{in}$ and $V_{ref}$, or may be any other suitable signal related to $V_{in}$ and/or $V_{ref}$.

Further, in embodiments which apply an auxiliary reference signal, auxiliary reference signal $V_{refx}$ may be any suitable fixed or varying reference signal that may be applied to the capacitor 502. $V_{refx}$ may in some cases have no relationship to signal $V_{ref}$, though in other cases, the auxiliary reference signal $V_{refx}$ may be related to the reference signal $V_{ref}$. For example, $V_{refx}$ may be a conditioned or unconditioned form of the reference signal $V_{ref}$. In some implementations, $V_{refx}$ may have a higher or lower voltage than $V_{ref}$. In other implementations, signal $V_{refx}$ may have a higher bandwidth and/or be noisier than the signal $V_{ref}$. If the signals are related, $V_{ref}$ and $V_{refx}$ may have any suitable relationship.

In the embodiment illustrated in FIG. 5, $V_{refx}$ is a noisy signal and $V_{ref}$ is a filtered form of that noisy signal. $V_{ref}$ and $V_{refx}$ may originate from a same source, but $V_{ref}$ may be generated by passing that original signal (e.g., $V_{refx}$) through a filtering circuit. The filtering circuit may be adapted to eliminate substantially all noise from the original signal such that $V_{ref}$ has a high signal-to-noise ratio and is substantially noiseless. The characteristics of the filtering circuit and the noise level of the signal $V_{ref}$ may be selected based on desired properties of the switched capacitor circuit, including desired charge/voltage accuracies and signal-to-noise ratios. It should be appreciated, though, that not all embodiments may implement a filtering circuit in this way. In other embodiments, $V_{ref}$ may have as much noise, more noise, or less noise than $V_{refx}$.

It should be appreciated that the circuit of FIG. 5 and the timing signals of FIG. 6 are only illustrative of the types of circuits that may be implemented in accordance with the techniques described herein and that others are possible. Embodiments are not limited to being implemented in a manner similar to that shown in FIG. 5 nor operating similarly to the example shown in FIG. 5.

Figure 10:
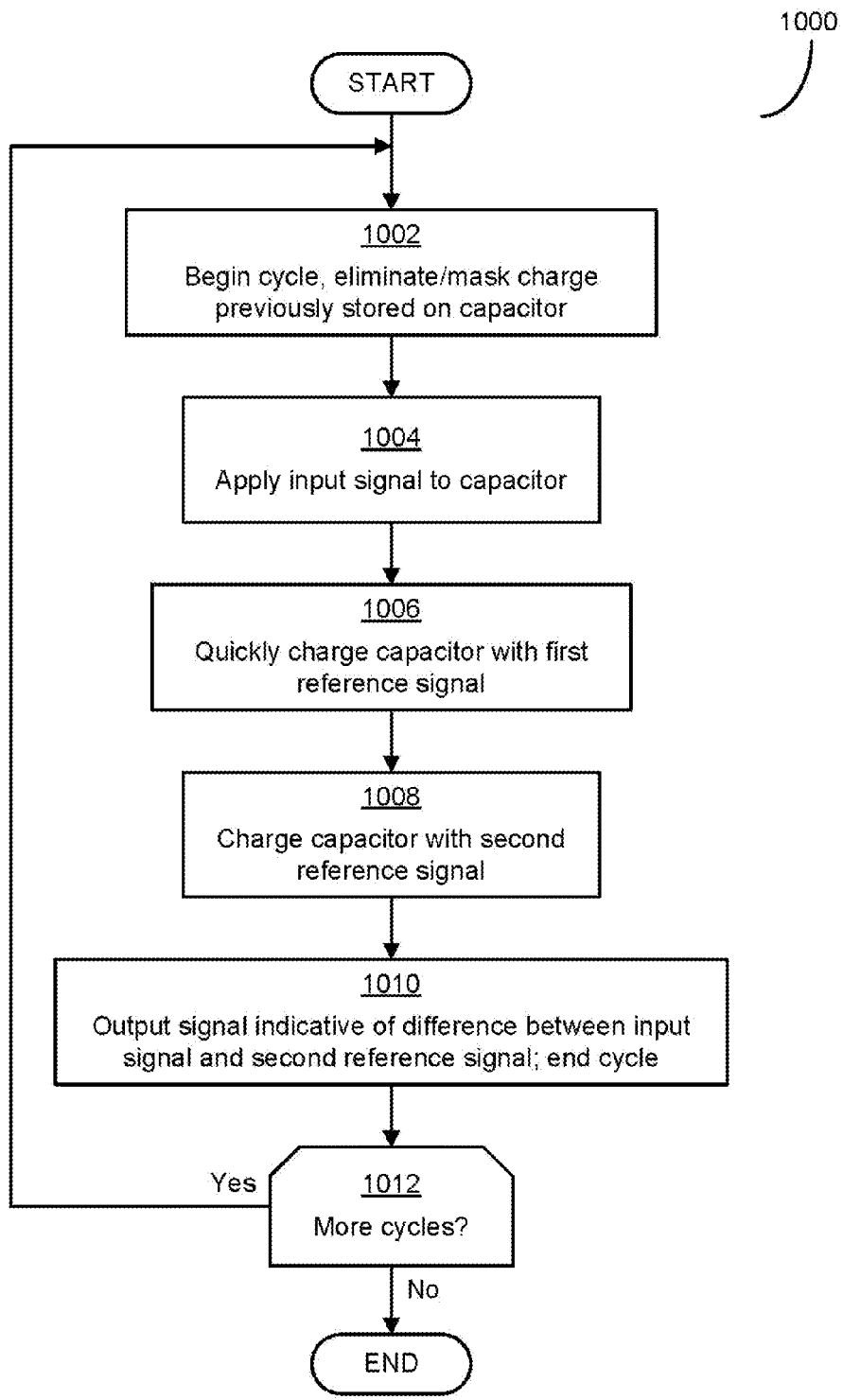
FIG. 10 is a flowchart of a first method of operating a switched-capacitor circuit in accordance with techniques described herein.

FIG. 10 shows a flowchart of one embodiment of a process for operating a switched-capacitor circuit in accordance with principles described herein.

The process 1000 begins in block 1002, in which a cycle begins and a previously-stored charge on a capacitor of the switched-capacitor circuit is eliminated, such as by discharging the capacitor, or masked, such as by discharging or charging the capacitor to a set level. Following the eliminating/masking of block 1002, an input signal is applied to the capacitor in block 1004 to charge/discharge the capacitor to a level corresponding to a value of the input signal.

In block 1006, following charging of the capacitor with the input signal, a first reference signal is applied to the capacitor to quickly charge the capacitor. After a period of time, a second reference signal is applied in block 1008 to charge the capacitor.

Following the charging of blocks 1006 and 1008, in block 1010 a signal is output indicative of a difference between the input signal and the second reference signal. The signal may only relate to a current difference between the input signal and the second reference signal, may relate to an integration over time of a difference between the input signal and the second reference signal, or may be any other suitable signal. Once the signal is output, the cycle ends.

In block 1012 it is determined whether there are any more cycles to be carried out. If so, then the process 1000 returns to block 1002 to begin a new cycle. If not, the process 1000 ends.

It should be appreciated that the process 1000 shown in FIG. 10 is merely illustrative. Embodiments are not limited to implementing the process 1000, as other processes are possible.

Figure 11:
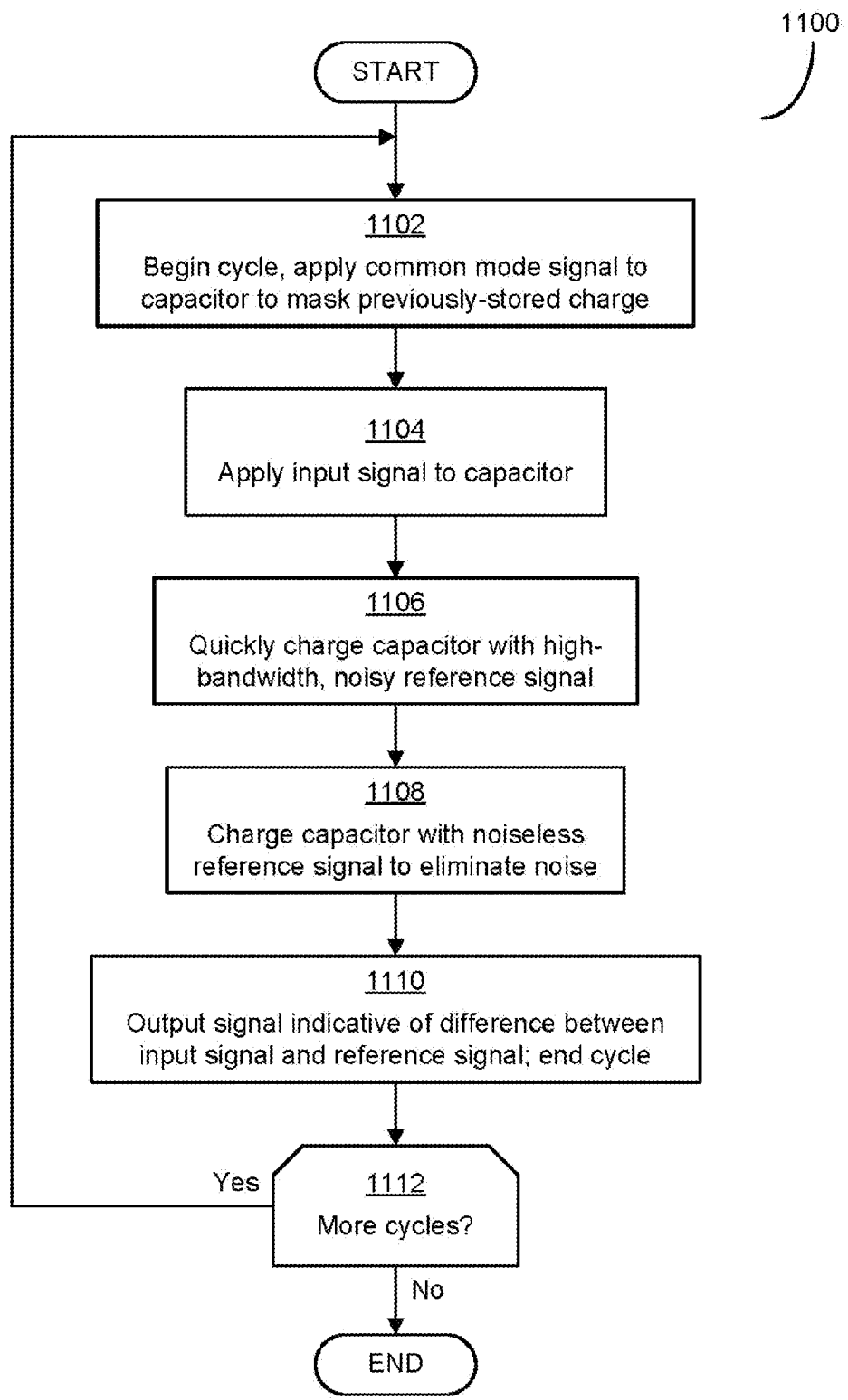
FIG. 11 is a flowchart of a second method of operating a switched-capacitor circuit in accordance with techniques described herein.

FIG. 11 shows another example of a process 1100 that may be implemented by some embodiments of the invention to operate a switched-capacitor circuit.

Process 1100 begins in block 1102, in which a cycle begins and a common mode signal is applied to a capacitor of the switched-capacitor circuit to mask a previously-stored charge (if any) on the capacitor with a new charge value. Applying the common-mode signal may include charging or discharging the capacitor, depending on the charge previously stored on the capacitor. In this way, at the start of each cycle the capacitor starts from a fixed value, rather than from a varying value dependent on conditions of previous cycles, and the cycles thus become independent of one another.

In block 1104, an input signal is applied to the capacitor to charge or discharge the capacitor to a value corresponding to a value of the input signal. For example, the capacitor may be charged to a value depending on a voltage of the input signal.

In block 1106, a high-bandwidth, noisy reference signal is applied to the capacitor to add a charge to or remove a charge from the capacitor, the charge being dependent on a value of the reference signal and/or a difference between the reference signal and the input signal. This charge is added/removed relatively quickly, as the reference signal of block 1106 is high-bandwidth. The capacitor thus has a particular charge following application of the high-bandwidth reference signal, though that particular charge is also representative of noise from the noisy reference signal.

In block 1108, a substantially noiseless reference signal is applied to the capacitor of the switched-capacitor circuit to eliminate the noise from the capacitor and the signal output from the capacitor.

In block 1110, the switched-capacitor circuits outputs a signal indicative of a difference between the input signal and the second reference signal. The signal may only relate to a current difference between the input signal and the second reference signal, may relate to an integration over time of a difference between the input signal and the second reference signal, or may be any other suitable signal. Once the signal is output, the cycle ends.

In block 1112 it is determined whether there are any more cycles to be carried out. If so, then the process 1100 returns to block 1102 to begin a new cycle. If not, the process 1100 ends.

It should be appreciated that the process 1100 shown in FIG. 11 is merely illustrative. Embodiments are not limited to implementing the process 1100, as other processes are possible.

Figure 12:
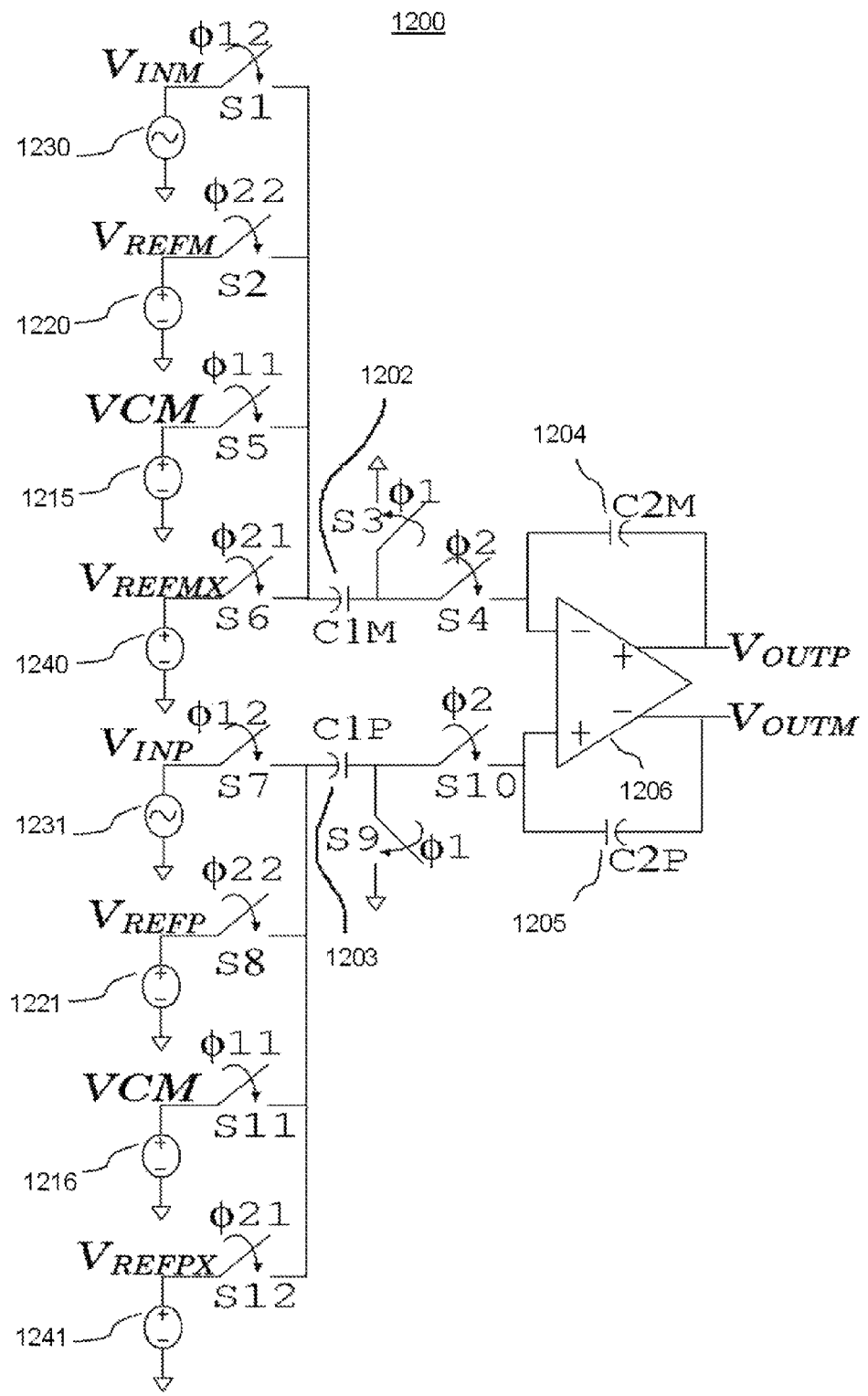
FIG. 12 is a diagram of a second embodiment of a switched-capacitor circuit operating according to techniques described herein.

FIG. 12 shows a second embodiment of a switched-capacitor circuit operating in accordance with techniques described herein.

FIG. 12 may be considered to be two of the circuits of FIG. 5 operating together and joined with a fully differential operational amplifier 1206. The first circuit comprises the upper half of the circuit (capacitor 1202 and switches S1-S6) and the second circuit comprises the lower half of the circuit (capacitor 1203 and switches S7-S12). In the configuration shown in FIG. 12, two input signals $V_{inm}$ and $V_{inp}$ are respectively provided to one of the two circuits. $V_{inm}$ and $V_{inp}$ are oppositely-signed versions of a same signal. The two signals may be 180 degrees out of phase with one another, may have amplitudes that are equal in magnitude and oppositely signed, or may be oppositely-signed in any other way. The two signals may be generated, for example, by passing an input signal $V_{in}$ through an inverter and providing both the input signal (e.g., $V_{inm}$) and the inverted input signal (e.g., $V_{inp}$) to the circuit 1200.

Each of the circuits of circuit 1200 operates with its own reference signals, $V_{refm}/V_{refxm}$ and $V_{refp}/V_{refxp}$. Each may receive the same common mode signal, though. In embodiments of the invention, the common mode signal is a value disposed between the $V_{inm}$ and $V_{inp}$, such as at a level approximately or precisely between average or maximum levels of those signals or at any other suitable level. In some cases, the common mode signal may be ground, though in other cases it may be a positive or negative voltage level.

The fully differential op-amp 1206 has capacitors 1204 and 1205 disposed along the feedback lines of the circuit. The fully differential op-amp 1206 generates two output signals that are, as with the input signals $V_{inm}$ and $V_{inp}$, oppositely signed $V_{outp}$ and $V_{outm}$ each represent an integrated difference between an input signal and a reference signal for one of the circuits. As each of those circuits receives one of the oppositely-signed input signals, the op-amp 1206 generates oppositely-signed output signals. Where the input signals $V_{inm}$ and $V_{inp}$ have a same magnitude, the output signals $V_{outp}$ and $V_{outm}$ may have a same magnitude as well, though embodiments are not limited to operating in this manner. In this way, regardless of a sign or polarity of an input signal that is provided, the circuit 1200 may generate a positive and a negative output signal indicating a difference between the input signal and a reference signal.

The circuit 1200 of FIG. 12 may operate as follows, according to timing signals shown in FIG. 6. A first cycle begins when a timing signal φ1 goes high, and switches S3 and S9 close in response to that signal to respectively couple capacitors 1202 and 1203 to ground. At a similar time (e.g., a short time before, at the same time, or a short time after), a timing signal φ11 goes high to begin a first subphase and switches S5 and S11 close to connect the sources 1215 and 1216 of the common mode signal $V_{CM}$ to the capacitors 1202 and 1203. The capacitors 1202, 1203 are then charged with the common mode signal to reduce, eliminate, or mask the charge previously stored on the capacitors 1202, 1203 from a previous cycle. The timing signal φ11 then goes low and timing signal φ12 goes high to start a second subphase. Switches S1 and S7 close in response to the signal φ12 and input signals $V_{inm}$ and $V_{inp}$ are respectively applied to capacitors 1202, 1203. After a time, the timing signal φ12 goes low and the timing signal φ1 goes low, and the capacitors 1202, 1203 are disconnected from the input signals and from ground.

At a similar time, a timing signal φ2 goes high and the switches S4 and S10 couple the capacitors 1202, 1203 to the fully differential op-amp 1206, configured as two inverting integrators through the feedback loops that includes capacitors 1204, 1205. A timing signal φ21 also goes high and during a third subphase switches S6 and S12 are closed to couple high-bandwidth and noisy auxiliary reference signals $V_{refmx}$ and $V_{refxp}$ to the capacitors 1202, 1203. The third subphase ends when the timing signal φ21 goes low, and a fourth subphase begins when the timing signal φ22 goes high to couple a substantially noiseless reference signals $V_{refm}$ and $V_{refp}$ to the capacitors 1202, 1203. In this embodiment of the invention, the reference signals may each have a same magnitude or may share other common properties, but may be oppositely signed.

While the reference signals $V_{refm}/V_{refxm}$ and $V_{refp}/V_{refxp}$ are being applied to the capacitors 1202, 1203, and while timing signal φ2 is high, the inverting integrating circuits of the fully differential op-amp 1206 are each integrating a difference between the input signal and the reference signal for one of the circuits. The top integrating circuit of the fully differential op-amp 1206—the one including capacitor 1204—integrates a difference between $V_{inm}$ and $V_{refm}$, and the bottom integrating circuit—the one including capacitor 1205—integrates a difference between $V_{inp}$ and $V_{refp}$. Though, it should be noted that because the circuits are inverting integrating circuits, the output of the integrating circuit will be oppositely signed from the input and reference signals which are being integrated. Though, because the input signals of this embodiment are oppositely-signed but have the same magnitude, the output signals will be oppositely signed but have the same magnitude. Thus, while the top integrating circuit produces an output signal based on input signal $V_{inm}$, its output signal can be considered the output corresponding to the input signal $V_{inp}$, and vise versa.

In this way, two output signals $V_{outp}$ and $V_{outm}$ are generated that are oppositely-signed but of similar magnitude, such that a difference between an input signal and a reference signal is available as both a positive and negative value and can be used in different applications.

It should be appreciated that the embodiments illustrated in FIGS. 5 and 12 are merely illustrative of the ways in which switched-capacitor circuits may be implemented in embodiments of the invention, and that embodiments are not limited to operating in the manner shown in FIGS. 5 and 12. Rather, embodiments may operate in any suitable manner according to the techniques described herein.

It should be further appreciated that embodiments of the techniques described herein, including the embodiments explicitly described herein, may address some, all, or none of the disadvantages recognized in the conventional circuits shown in FIGS. 1-3. It should be appreciated that desirable characteristics may vary between environments and applications and that circuits may vary between environments and applications. Thus, while several disadvantages of the circuits 100, 200, and 300 of FIGS. 1-3 were noted above, it should be appreciated that not all embodiments may address all of these disadvantages and some may also include these disadvantages.

Some embodiments described herein operate in a circuit comprising a switched-capacitor circuit. Some switched-capacitor circuits include at least a capacitor and a switch, such that upon operation of the switch the capacitor is connected and disconnected from at least one other circuit and is charged and/or discharged by the at least one other circuit.

Some switched capacitor circuits may be implemented that include other components and perform more complex operations, such as being implemented as a switched-capacitor modulator. For example, two inputs may be provided to a switched-capacitor circuit with at least two switches, such that a capacitor may be charged/discharged by one input and then charged/discharged by another input. For example, an input signal may be used as a first input and a reference signal may be used as a second input. More than two inputs may also be provided, including signals selected from a group including a common mode signal, an input signal, a first reference signal, and/or a second reference signal, though others are possible. An output of a switched capacitor circuit may also be coupled to other components or perform other operations, including being connected to circuits to perform integration operations, differential operations, addition or subtraction (e.g., positive or negative gain) operations, etc.

In one particular implementation, a switched-capacitor circuit is connected at least on an input side to an input signal and to a reference signal and on an output side to an integrating circuit. The circuit may be configured to perform an integration operation using the integrating circuit to integrate, over time, a difference between the input signal and the reference signal. The switched-capacitor circuit may also be adapted to accept as input one or more of a common mode signal or a second reference signal.

Switched-capacitor circuits may be included in many different circuits and systems. For example, in some embodiments, switched-capacitor circuits operating according to techniques described herein may be implemented in analog-to-digital converters, phase-locked loops (PLLs), and other circuits. Though, switched-capacitor circuits may also be implemented as a stand-alone circuit, without other circuits or systems.

In various examples described above, signals were described as being applied to a capacitor and charging the capacitor. Though, it should be appreciated that whether a signal charges or discharges a capacitor is dependent on properties of the signal and the capacitor, including values of the signal and the capacitor at the time the signal is applied to the capacitor. Thus, in some cases a signal may be applied to a capacitor and may discharge the capacitor. For ease of description, the examples described above discussed the signals and the capacitor only in terms of charging the capacitor. Though, it should be appreciated that any or all of the signals may discharge the capacitor and that, in some cases, some signals may charge the capacitor and others may discharge the capacitor, and some may charge or discharge a capacitor depending on the signal at that time or the charge stored on the capacitor at that time. For example, an input signal may charge a capacitor and a reference signal may discharge a capacitor, or vise versa. Embodiments are not limited to being implemented only with signals that charge a capacitor.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of operating a switched-capacitor circuit, the method comprising:
   setting a signal value of a first signal based at least in part on a signal value of an input signal;
   applying the first signal to a capacitor such that the capacitor has a first amount of charge, wherein the first signal is a signal held at a constant voltage value during the applying of the first signal;
   applying the input signal to the capacitor having the first amount of charge, such that the first amount of charge is changed by the input signal; and
   applying a reference signal to the capacitor following application of the input signal.

2. The method of claim 1, wherein applying the reference signal comprises:
   first applying an unfiltered form of the reference signal to the capacitor; and
   second applying a filtered form of the reference signal to the capacitor.

3. The method of claim 2, wherein the first applying is performed until the unfiltered form of the reference signal is substantially settled.

4. The method of claim 1, wherein applying the reference signal comprises applying a noisy reference signal, and
   wherein the method further comprises second applying a substantially noiseless reference signal.

5. The method of claim 1, further comprising:
   maintaining the first signal at a level proportional to the input signal.

6. The method of claim 1, further comprising:
   during a first phase, decoupling the capacitor from an integrating circuit and coupling the capacitor to a first signal line at which is applied the first signal;
   during a second phase following the first phase, decoupling the capacitor from the first signal line and coupling the capacitor to a second signal line at which is applied the input signal; and
   following the second phase, decoupling the capacitor from the second signal line, coupling the capacitor to a third signal line at which is applied the reference signal, and coupling the capacitor to the integrating circuit.

7. The method of claim 6, wherein coupling the capacitor to a third signal line following the second phase comprises, during a third phase, coupling the capacitor to the third signal line at which is applied an unfiltered form of the reference signal, and
   wherein the method further comprises, during a fourth phase following the third phase, decoupling the capacitor from the third signal line and coupling the capacitor to a fourth signal line at which is applied a filtered form of the reference signal.

8. The method of claim 6, further comprising:
   during the first phase, decoupling a second capacitor from the integrating circuit and coupling the second capacitor to the first signal line at which is applied the first signal;
   during the second phase following the first phase, decoupling the second capacitor from the first signal line and coupling the capacitor to a fourth signal line at which is applied an oppositely-signed input signal being an inverted form of the input signal; and
   following the second phase, decoupling the second capacitor from the fourth signal line, coupling the capacitor to a fifth signal line at which is applied a second reference signal, and coupling the capacitor to the integrating circuit, wherein the integrating circuit produces as output a first value indicative of a first difference between the input signal and the reference signal and a second value indicative of a second difference between the second input signal and the second reference signal, the first value and the second value having a same magnitude.

9. A circuit comprising:

a capacitor;

a first node adapted to receive an input signal and coupled via a first switch to a terminal of the capacitor;

a second node adapted to receive a reference signal and coupled via a second switch to the terminal of the capacitor; and a third node adapted to receive a first signal, the first signal being a constant voltage signal having a signal value set based on a signal value of the input signal, and coupled via a third switch to the terminal of the capacitor.

10. The circuit of claim 9, wherein the circuit is adapted to sample the input signal by charging the capacitor with the input signal, and is adapted to apply the first signal to the capacitor prior to sampling the input signal.

11. The circuit of claim 9, further comprising a voltage divider coupled to the first node, and wherein the third node is an intermediate node of the voltage divider.

12. The circuit of claim 9, wherein the second node is adapted to receive an unfiltered form of the reference signal, and wherein the circuit further comprises a fourth node adapted to receive a filtered form of the reference signal and coupled via a fifth switch to the terminal of the capacitor.

13. The circuit of claim 12, further comprising:

a second capacitor having a first terminal connected to the second node and a second terminal connected to the fourth node, and wherein the second capacitor acts to filter the unfiltered form of the reference signal to yield the filtered form of the reference signal.

14. The circuit of claim 9, wherein the second node is adapted to receive a noisy auxiliary reference signal, and wherein the circuit further comprises a fourth node adapted to receive a noiseless reference signal that is substantially noiseless as compared to the noisy auxiliary reference signal.

15. The circuit of claim 9, wherein the circuit is adapted to operate to:

during a first phase, decouple the capacitor from an integrating circuit by opening a fourth switch and couple the capacitor to the third node by closing the third switch;

during a second phase following the first phase, decouple the capacitor from the third node by opening the third switch and couple the capacitor to the first node by closing the first switch; and following the second phase, decouple the capacitor from the first node by opening the first switch, couple the capacitor to the second node by closing the second switch, and couple the capacitor to the integrating circuit by closing the fourth switch.

16. The circuit of claim 9, wherein coupling the capacitor to the second node following the second phase comprises, during a third phase, coupling the capacitor to the second node at which is applied an unfiltered form of the reference signal, and wherein the circuit is further adapted to operate to, during a fourth phase following the third phase, decouple the capacitor from the second node and couple the capacitor to a fifth node at which is applied a filtered form of the reference signal.

17. The circuit of claim 9, further comprising:

a second capacitor;

a fifth node adapted to receive a second input signal and coupled via a fifth switch to a terminal of the capacitor, the second input signal being an inverted form of the input signal;

a sixth node adapted to receive a second reference signal and coupled via a sixth switch to the terminal of the second capacitor;

a seventh node adapted to receive the first signal and coupled via a seventh switch to the terminal of the second capacitor; and a second output node, wherein the integrating circuit comprises a differential operational amplifier coupled to the output node and the second output node, and wherein the integrating circuit produces at the first output node a first value indicative of a first difference between the input signal and the reference signal and produces at the second output node a second value indicative of a second difference between the second input signal and the reference signal.

18. A method of operating a switched-capacitor circuit, the method comprising:

applying an input signal to a capacitor such that an amount of charge stored by the capacitor is changed by the input signal;

applying a first reference signal to the capacitor such that the amount of charge is changed by the first reference signal; and applying a second reference signal to the capacitor such that the amount of charge is changed by the second reference signal, wherein the first reference signal is a noisier signal than the second reference signal.

19. The method of claim 18, further comprising:

prior to applying the input signal, applying a first signal to the capacitor such that the capacitor has a first amount of charge, the first signal being related to the second reference signal.

20. The method of claim 19, further comprising:

maintaining an amplitude of the first signal as a fraction of the second reference signal.

21. The method of claim 18, wherein the first reference signal has a higher bandwidth than the second reference signal.

22. The method of claim 18, wherein the first reference signal has a lower signal-to-noise ratio than the second reference signal.

23. The method of claim 22, further comprising:

filtering the first reference signal to produce the second reference signal.

24. The method of claim 18, further comprising:

during a first phase, decoupling the capacitor from an integrating circuit and coupling the capacitor to a first signal line at which is applied the input signal;

during a second phase following the first phase, decoupling the capacitor from the first signal line, coupling the capacitor to a second signal line at which is applied the first reference signal, and coupling the capacitor to the integrating circuit; and during a third phase following the second phase, decoupling the capacitor from the second signal line, coupling the capacitor to a third signal line at which is applied the second reference signal.

25. The method of claim 24, further comprising:
during the first phase, following decoupling the capacitor from the integrating circuit and prior to coupling the capacitor to the first signal line, coupling the capacitor to a fourth signal line at which is applied a common mode signal.

26. A circuit comprising:
a capacitor;
a first node adapted to receive an input signal and coupled via a first switch to a terminal of the capacitor;
a second node adapted to receive a first reference signal having a first signal-to-noise ratio (SNR) and coupled via a second switch to the terminal of the capacitor; and
a third node adapted to receive a second reference signal that has a second SNR lower than the first SNR and coupled via a third switch to the terminal of the capacitor.

27. The circuit of claim 26, wherein the first reference signal has a higher bandwidth than the second reference signal.

28. The circuit of claim 26, wherein the first reference signal has a lower signal-to-noise ratio than the second reference signal.

29. The circuit of claim 26, further comprising:
a second capacitor having a first terminal connected to the second node and a second terminal connected to the third node, and
wherein the second capacitor acts to filter the first reference signal to yield the second reference signal.

30. The circuit of claim 26, further comprising:
a fourth node at which is applied a first signal related to the second reference signal.

31. The circuit of claim 30, further comprising a voltage divider coupled to the third node, and
wherein the fourth node is an intermediate node of the voltage divider.

32. The circuit of claim 26, wherein the circuit is adapted to operate to:
during a first phase, decouple the capacitor from an integrating circuit by opening a fourth switch and couple the capacitor to the first node by closing the first switch;
during a second phase following the first phase, decouple the capacitor from the first node by opening the first switch, couple the capacitor to the second node by closing the second switch, and couple the capacitor to the integrating circuit by closing the fourth switch; and
during a third phase following the second phase, decouple the capacitor from the second node by opening the second switch and coupling the capacitor to the third node by closing the third switch.

33. The circuit of claim 32, wherein the circuit is further adapted to:
during the first phase, following decoupling the capacitor from the integrating circuit and prior to coupling the capacitor to the first node, coupling the capacitor to a fourth signal line at which is applied a common mode signal by closing a fifth switch.

* * * * *